(12) United States Patent
Müller et al.

(10) Patent No.: US 11,073,559 B2
(45) Date of Patent: Jul. 27, 2021

(54) ELECTRICAL SYSTEM AND METHOD FOR DIAGNOSING THE FUNCTIONALITY OF POWER RELAYS IN AN ELECTRICAL SYSTEM

(71) Applicant: Volkswagen Aktiengesellschaft, Wolfsburg (DE)

(72) Inventors: Jens Uwe Müller, Vellmar (DE); Lan Dang Hung, Hannover (DE); Markus Stolz, Rühen (DE); Hendrik Gerth, Ronnenberg (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 392 days.

(21) Appl. No.: 16/225,323

(22) Filed: Dec. 19, 2018

(65) Prior Publication Data
US 2019/0187211 A1 Jun. 20, 2019

(30) Foreign Application Priority Data
Dec. 19, 2017 (DE) ...................... 10 2017 223 229.3

(51) Int. Cl.
*G01R 31/327* (2006.01)
*H01H 47/00* (2006.01)
(Continued)

(52) U.S. Cl.
CPC ....... *G01R 31/3278* (2013.01); *G01R 31/006* (2013.01); *G01R 31/54* (2020.01);
(Continued)

(58) Field of Classification Search
CPC .. G01R 31/3278; G01R 31/54; G01R 31/006; G01R 31/52; H01H 47/002; H02J 7/0031; H02J 7/345; H02M 3/33553
(Continued)

(56) References Cited

U.S. PATENT DOCUMENTS

2007/0115604 A1 5/2007 Zettel et al.
2007/0139005 A1 6/2007 Osawa
(Continued)

FOREIGN PATENT DOCUMENTS

CN 103698695 A 4/2014
CN 104678295 A 6/2015
(Continued)

OTHER PUBLICATIONS

Cheng; Translation of CN-204903702-U; 2015; EPO & Google Translate (Year: 2015).*

*Primary Examiner* — Melissa J Koval
*Assistant Examiner* — Rahul Maini
(74) *Attorney, Agent, or Firm* — Pearl Cohen Zedek Latzer Baratz LLP (57) ABSTRACT

An electrical system comprises at least one high-voltage battery, at least one DC link capacitor and at least two power relays, whereby one power relay is arranged between a positive connector of the high-voltage battery and the DC link capacitor, while the other power relay is arranged between a negative connector of the high-voltage battery and the DC link capacitor, whereby the electrical system has a galvanically isolated DC/DC converter that is connected to a voltage source in the electrical system, whereby the DC/DC converter is configured such that it can transmit electric energy to a high-voltage side with the DC link capacitor in order to pre-charge the DC link capacitor, whereby the electrical system has a diagnostic device to test the power relays, whereby the diagnostic device has switchable voltage sensors.

6 Claims, 3 Drawing Sheets

(51) Int. Cl.
*H02J 7/34* (2006.01)
*H02M 3/335* (2006.01)
*G01R 31/00* (2006.01)
*H02J 7/00* (2006.01)
*G01R 31/54* (2020.01)
*G01R 31/52* (2020.01)

(52) U.S. Cl.
CPC ......... *H01H 47/002* (2013.01); *H02J 7/0031* (2013.01); *H02J 7/345* (2013.01); *H02M 3/33553* (2013.01); *G01R 31/52* (2020.01)

(58) Field of Classification Search
USPC .......................................................... 324/418
See application file for complete search history.

(56) References Cited

U.S. PATENT DOCUMENTS

| | | | |
|---|---|---|---|
| 2008/0048621 A1* | 2/2008 | Yun | H02J 7/0031 320/136 |
| 2013/0134942 A1* | 5/2013 | Sakurai | H02J 7/0021 320/118 |
| 2013/0257446 A1 | 10/2013 | Soell et al. | |
| 2013/0307471 A1* | 11/2013 | Ichikawa | H02J 7/025 320/108 |
| 2015/0054517 A1 | 2/2015 | Yonezaki et al. | |
| 2015/0084404 A1 | 3/2015 | Hashim et al. | |
| 2015/0115972 A1 | 4/2015 | Park | |
| 2015/0185271 A1 | 7/2015 | Kim et al. | |
| 2016/0211679 A1 | 7/2016 | Rabbers et al. | |
| 2017/0257089 A1 | 9/2017 | Zehetbauer | |
| 2020/0220348 A1* | 7/2020 | Oishi | H02J 7/0031 |

FOREIGN PATENT DOCUMENTS

| | | | | |
|---|---|---|---|---|
| CN | 104749459 A | | 7/2015 | |
| CN | 105004988 A | | 10/2015 | |
| CN | 105137336 A | | 12/2015 | |
| CN | 204903702 U | * | 12/2015 | ............ G01R 31/12 |
| CN | 105765395 A | | 7/2016 | |
| CN | 205665378 U | | 10/2016 | |
| CN | 106646216 A | | 5/2017 | |
| DE | 102 49 568 A1 | | 5/2004 | |
| DE | 10 2006 050 529 A1 | | 4/2008 | |
| DE | 10 2006 054 294 B4 | | 4/2009 | |
| DE | 10 2011 004 510 A1 | | 8/2012 | |
| DE | 10 2011 004 516 A1 | | 8/2012 | |
| DE | 10 2012 204 866 A1 | | 10/2013 | |
| DE | 10 2014 219 395 A1 | | 3/2015 | |
| DE | 10 2015 008 467 A1 | | 1/2016 | |
| DE | 10 2016 201 165 A1 | | 8/2016 | |
| DE | 10 2015 209 081 A1 | | 11/2016 | |
| DE | 10 2016 203 355 A1 | | 9/2017 | |
| KR | 2015 006 4623 A | | 6/2015 | |
| KR | 2014 013 6844 A | | 5/2020 | |
| WO | WO 2014/090551 A2 | | 6/2014 | |

\* cited by examiner

ELECTRICAL SYSTEM AND METHOD FOR DIAGNOSING THE FUNCTIONALITY OF POWER RELAYS IN AN ELECTRICAL SYSTEM

CROSS REFERENCE TO RELATED APPLICATION

This application claims priority from German Patent Application No. 10 2017 223 229.3, filed Dec. 19, 2017, which is incorporated herein by reference in its entirety.

FIELD OF THE INVENTION

The invention relates to an electrical system and to a method for diagnosing the functionality of power relays in an electrical system.

BACKGROUND OF THE INVENTION

Electric or hybrid vehicles primarily use a battery system, a fuel-cell system or the like as the source of energy for the traction network to which one or more consumers are connected via power electronics having a DC link capacitor. As a rule, relays, contactors or semiconductor switches are used in the two connecting lines as disconnectors between the source of energy and the traction network in order to connect or disconnect the energy transmission. Without additional measures, however, the consumers cannot be connected to the power electronics and to the discharged DC link capacitor by closing the switches. The switch-on current resulting from the low inner resistance of the source (usually below 1 ohm) and from the large potential difference can cause thermal overload, damage and even destruction of individual components in the traction network.

A remedy for this is provided by the so-called pre-charge circuit for example, a series circuit consisting of a switch and of a pre-charging resistor that is arranged in parallel to a disconnector. This switch disconnects the positive pole of the source from the connector to the positive pole of the DC link capacitor as proxy for all of the DC link capacitors in the traction network. When the vehicle is started, first of all, the opposite disconnector, which is arranged between the negative pole of the source and the connector to the negative pole of the DC link capacitor, is closed, and subsequently, the switch of the pre-charge circuit is closed. Thanks to the pre-charging resistor that serves to limit the current peak, the DC link capacitor can be charged in a controlled manner until the voltage difference between the source of energy and the consumers has fallen below a threshold value (e.g. 10 V, in order to protect against overloading of or damage to conventional contactors) and the other disconnector can be closed. Subsequently, the switch in the pre-charge circuit can be opened once again.

Such a pre-charge circuit is disclosed, for example, in German patent application DE 10 2011 004 510 A1. This document discloses an electric circuit for diagnosing switching contacts, especially in a battery-powered road vehicle, whereby one or more electric switches are each connected on the input side and on the output side to various connectors of a battery control unit, and whereby one or more of the connectors of the battery control unit are each coupled to a measuring tap in order to generate a measuring-circuit voltage relating to a reference potential, whereby there are first means for adjusting the measuring-circuit voltage to a prescribed voltage value and/or second means for generating and measuring a voltage drop by means of an electric resistor element that is serially connected to one of the switches.

German patent specification DE 10 2006 054 294 B4 discloses a method for monitoring an electric relay in a circuit that conducts electric energy from a storage device to a controllable load device, whereby a resistor device is permanently connected in parallel to the electric relay. In this process, a low electric load state is detected at the load device and the load device is actuated to operate at a known current drain level, whereby the relay is actuated into the open position. Moreover, the electric power is measured at a nodal point that encompasses the relay device, the controllable electric load device and the resistor device. Then, on the basis of the electric power measured at the nodal point, the determination is made as to whether the relay that has been actuated into the open position is open or closed.

International patent application WO 2014/090551 A2 discloses a pre-charge circuit for charging a DC link capacitor having a first electronic component, a second electronic component and a diagnostic device, whereby the diagnostic device is configured to test the function of the first and/or second electronic component and it comprises a source of energy with a terminal voltage. A voltage drop at the first electronic component can be brought about by means of the source of energy, as a result of which the functionality of the first electronic component and/or of the second electronic component can be tested. Moreover, the diagnostic circuit has a diagnostic switch by means of which the source of energy can be connected to the first electronic component in such a way that the voltage dropping at the first electronic component corresponds to the terminal voltage.

German patent application DE 10 2014 219 395 A1 discloses a vehicle comprising a traction battery, a contactor that is configured to connect the traction battery and an electric impedance, and a pre-charge circuit that, in response to a close signal for the contactor, is configured to control the flow of current from the traction battery through the pre-charge circuit to the electrical impedance in order to increase the voltage at the electric impedance in such a way that, as the voltage approaches a voltage of the traction battery, a duty cycle of the pre-charge circuit approaches 100% and the current through the pre-charge circuit approaches zero. The contactor is closed in response to a magnitude of the current falling below a predetermined value.

German patent application DE 10 2015 209 081 A1 discloses a generic electrical system comprising at least one high-voltage battery, at least one low-voltage battery, a DC/DC converter arranged between the batteries, at least one power relay between the high-voltage battery and the DC/DC converter, and at least one DC link capacitor, whereby the electrical system has at least one circuit for pre-charging the DC link capacitor. In this context, the circuit is configured as a galvanically isolated DC/DC converter that is connected to a voltage source in the electrical system, whereby the DC/DC converter is configured such that it can transmit electric energy to a high-voltage side with the DC link capacitor in order to pre-charge the DC link capacitor. In this context, the DC/DC converter between the high-voltage battery and the low-voltage battery can be configured as a bidirectional DC/DC converter which is then used for the pre-charging. As an alternative, the DC/DC converter can be configured as a step-down converter and can be connected in parallel to the power relay.

As an alternative, the DC/DC converter can be configured as a step-up converter that is integrated into a high-voltage component (for instance, an inverter or a charger), whereby the DC/DC converter is connected to the low-voltage battery. Moreover, there is at least one diagnostic unit which is configured in such a way that the energy transmission for charging the DC link capacitor is determined and, on this basis, a state of the high-voltage side is determined. A problem encountered with this electrical system is that the previous diagnostic options for the power relay are no longer possible.

SUMMARY OF THE INVENTION

The invention is based on the technical objective of putting forward an electrical system where the functionality of the power relay can be tested and also on the objective of putting forward a suitable method for testing the function.

The technical objective is achieved by means of an electrical system having the features of the independent claims. Additional advantageous embodiments of the invention can be gleaned from the subordinate claims.

Towards this end, the electrical system comprises at least one high-voltage battery, at least one DC link capacitor and at least two power relays, whereby one power relay is arranged between a positive connector of the high-voltage battery and the DC link capacitor, while the other power relay is arranged between a negative connector of the high-voltage battery and the DC link capacitor, whereby the electrical system has a galvanically isolated DC/DC converter that is connected to a voltage source in the electrical system, whereby the DC/DC converter is configured such that it can transmit electric energy to a high-voltage side with the DC link capacitor in order to pre-charge the DC link capacitor. Regarding the conceivable embodiments of the DC/DC converter, reference is hereby made to German patent application DE 10 2015 209 081 A1. In this context, it should be pointed out that the term "power relay" should not be construed in any limiting manner and should also include, for instance, contactors. The term "high-voltage battery" should also include fuel cells.

Moreover, the electrical system has a diagnostic device to test the power relays, whereby the diagnostic device has switchable voltage sensors. In this context, one voltage sensor is arranged in parallel to the high-voltage battery, one voltage sensor is arranged in parallel to the DC link capacitor, in each case, one voltage sensor is arranged in parallel to the power relay, one voltage sensor is arranged between the positive connector of the high-voltage battery and the negative connector of the DC link capacitor, and one voltage sensor is arranged between the negative connector of the high-voltage battery and a connector between the power relays and the positive connector of the DC link capacitor. Here, a fuse can be arranged between the power relay and the positive connector of the DC link capacitor, whereby the connector for the voltage sensor is then situated between the power relay and the fuse.

In an alternative embodiment, the electrical system has a diagnostic device for testing the power relay, whereby the diagnostic device has a switchable voltage sensor arranged in parallel to the high-voltage battery, at least one switchable source of energy and several switches.

The diagnostic device can then systematically actuate the switchable voltage sensors or the switches in a prescribed sequence in order to first test the elements of the diagnostic device itself and then finally to test the functionality of the power relays.

In one embodiment, the switchable source of energy is configured as a voltage source to which a resistor is connected in series, whereby another resistor and a voltage sensor are arranged in parallel to the series circuit comprising the resistor and the voltage source, whereby a first switch is situated between the positive connector of the high-voltage battery and a positive connector of the switchable voltage source. A second switch is situated between the positive connector of the switchable voltage source and the negative connector of the DC link capacitor. A third switch is situated between the negative connector of the switchable voltage source and the negative connector of the high-voltage battery. A fourth switch is situated between the negative connector of the switchable voltage source and a connecting point between the power relay and the positive connector of the DC link capacitor. A fifth switch is connected in series to a resistor parallel to a fuse that is situated between the connecting point for the fourth switch and the positive connector of the DC link capacitor. As a result, the number of voltage sensors is reduced and replaced by simple switches.

In an alternative embodiment, the switchable source of energy is configured as a current source to which a voltage sensor is arranged in parallel. Here, a first switch is situated between the positive connector of the high-voltage battery and a positive connector of the switchable current source. A second switch is situated between the positive connector of the switchable current source and a negative connector of the DC link capacitor. A third switch is situated between the negative connector of the switchable current source and a negative connector of the high-voltage battery. A fourth switch is situated between the negative connector of the switchable current source and a connecting point between the power relay and a positive connector of the DC link capacitor. A fifth switch that is connected in series to a resistor is situated between the connector of the fourth switch and the negative connector of the DC link capacitor. The advantage in comparison to the embodiment with the switchable voltage source is that it requires two fewer resistors.

In an alternative embodiment, the switchable source of energy is the high-voltage battery, whereby a first switch and a second switch are arranged in parallel to the power relay at the positive connector, while a third switch and a fourth switch are arranged in parallel to the power relay at the negative connector, whereby a voltage sensor with a parallel-connected resistor is arranged between the center taps between the first and second switches as well as between the third and fourth switches. Moreover, a fifth switch with a series-connected resistor is arranged in parallel to the power relay at the positive connector of the high-voltage battery, and a sixth switch with a series-connected resistor is arranged in parallel to the power relay at the negative connector of the high-voltage battery, whereby a seventh switch that is connected in series to a resistor is arranged between the center tap between the first and second switches and a positive connector of the DC link capacitor.

BRIEF DESCRIPTION OF THE DRAWINGS

The invention will be explained in greater detail below making reference to preferred embodiments. The following is shown in the figures.

DETAILED DESCRIPTION OF THE INVENTION

Figure 1:
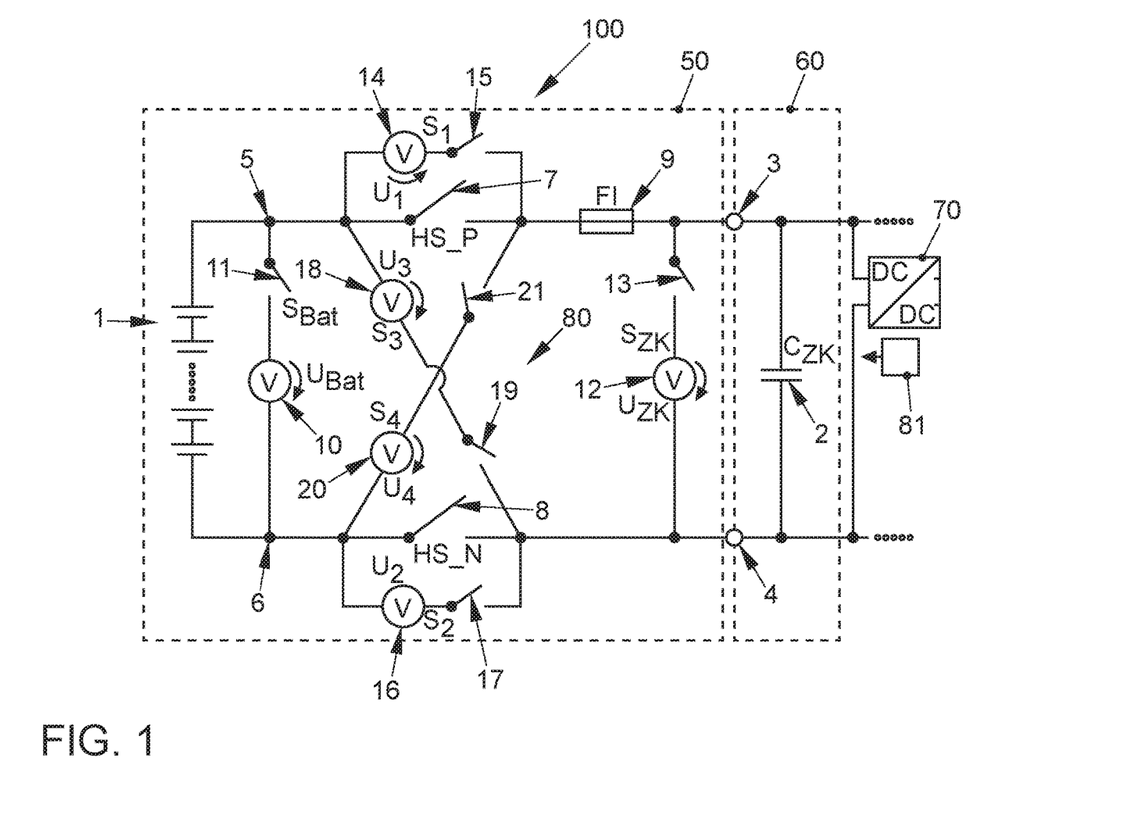
FIG. 1: an electrical system in a first embodiment.

FIG. 1 shows an electrical system 100 in a first embodiment. The electrical system 100 comprises a high-voltage source of energy 50 and a traction network 60 having a DC link capacitor 2. Moreover, the electrical system 100 comprises a galvanically isolated DC/DC converter 70 to precharge the DC link capacitor 2 and it also comprises a diagnostic device 80. The diagnostic device 80 comprises a control unit 81 as well as six switchable voltage sensors $S_{Bat}$, $S_{ZK}$, S1-S4.

The high-voltage source of energy 50 comprises a high-voltage battery 1 consisting of a plurality of battery cells that have a positive pole or positive connector 5 and a negative pole or negative connector 6. At the positive pole 5, there is a power relay 7 that is situated between the positive pole 5 and a positive pole or connector 3 of the DC link capacitor 2, whereby in addition, a fuse 9 is connected in series. Accordingly, a second power relay 8 is arranged between the negative pole 6 of the high-voltage battery 2 and a negative connector 4 of the DC link capacitor 2. In this context, a switchable voltage sensor $S_{Bat}$ is arranged in parallel to the high-voltage battery 1 and it comprises a switch 11 and a voltage sensor 10. Another switchable voltage sensor $S_{ZK}$ is arranged in parallel to the DC link capacitor 2 and it comprises a switch 13 as well as a voltage sensor 12. The switchable voltage sensor S1 with a switch 15 and a voltage sensor 14 is arranged in parallel to the first power relay 7. The switchable voltage sensor S2 with a switch 17 and a voltage sensor 16 is arranged in parallel to the second power relay 8. Another switchable voltage sensor S3 with a switch 19 and a voltage sensor 18 is arranged between the positive pole 5 and the negative connector 4. Finally, a switchable voltage sensor S4 with a switch 21 and with a voltage sensor 20 is arranged between the negative pole 6 and a connector between the first relay 7 and the fuse 9.

In order to ensure functional safety when the traction network 60 is connected to or disconnected from the high-voltage source 50, it is necessary to first plausibilize not only the states of the power relays 7, 8 but also those of the switchable sensors $S_{Bat}$, $S_{ZK}$, S1-S4 and of the fuse 9.

In a first initial step, the switch 11 is closed, whereby the voltage sensor 10 would then have to measure the voltage $U_{Bat}$ of the high-voltage battery 1. This voltage, which is being detected anyway, can be plausibilized using the detected individual voltages of the battery cells. If the deviation of $U_{Bat}$ relative to the sum of the individual voltages of the battery cells is smaller than a threshold value (for example, 10 V), then the switchable voltage sensor $S_{Bat}$ is operating properly.

A total of seven mesh equations is available for purposes of diagnosing the other switchable voltage sensors S1-S4, $S_{ZK}$ as well as the fuse 9. Thus, the functionality of all of the elements can be unambiguously tested. Starting from the initial state in which the sensor $S_{Bat}$ was plausibilized and its switch 11 is closed and all of the other switches are open, all of the remaining elements are tested, either one at a time or at the same time.

$1^{st}$ mesh: switches 17 and 19 are closed. Mesh loop via $S_{Bat}$ (10), S3 (18) and S2 (16). The sum of the voltages should be zero or should be below a threshold value (for instance, 3×5 V=15 V with a measuring tolerance of ±2.5 V of the individual sensors).

$2^{nd}$ mesh: switches 15 and 21 are closed. Mesh loop via $S_{Bat}$ (10), S1 (14) and S4 (20). The sum of the voltages should be zero or should be below a threshold value (for instance, 3×5 V=15 V with a measuring tolerance of ±2.5 V of the individual sensors).

$3^{rd}$ mesh: switches 13, 15 and 17 are closed. Mesh loop via $S_{Bat}$ (10), S1 (14), FI (9), $S_{ZK}$ (12) and S2 (16). The sum of the voltages should be zero or should be below a threshold value (for instance, 4×5 V=20 V with a measuring tolerance of ±2.5 V of the individual sensors).

$4^{th}$ mesh: switches 13, 15 and 19 are closed. Mesh loop via S3 (18), S1 (14), FI (9) and $S_{ZK}$ (12). The sum of the voltages should be zero or should be below a threshold value (for instance, 3×5 V=15 V with a measuring tolerance of ±2.5 V of the individual sensors).

$5^{th}$ mesh: switches 13, 17 and 21 are closed. Mesh loops via S4 (20), FI (9), $S_{ZK}$ (12) and S2 (16). The sum of the voltages should be zero or should be below a threshold value (for instance, 3×5 V=15 V with a measuring tolerance of ±2.5 V of the individual sensors).

$6^{th}$ mesh: switches 13, 19 and 21 are closed. Mesh loops via $S_{Bat}$ (10), S3 (18), $S_{ZK}$ (12) FI (9) and S4 (20). The sum of the voltages should be zero or should be below a threshold value (for instance, 4×5 V=20 V with a measuring tolerance of ±2.5 V of the individual sensors).

$7^{th}$ mesh: switches 15, 17, 19 and 21 are closed. Mesh loops via S1 (14), S4 (20), S2 (16) and S3 (18). The sum of the voltages should be zero or should be below a threshold value (for instance, 4×5 V=20 V with a measuring tolerance of ±2.5 V of the individual sensors).

Once all of the switchable voltage sensors have been plausibilized, the two power relays 7, 8 can be diagnosed. If one of these two relays is stuck, then the parallel-connected voltage sensor 14 or 16 measures a voltage below a prescribed threshold value (of, for example, 5 V).

The advantage of this circuit is that it is very fast since the DC link capacitor 2 does not have to be charged or charge-reversed. Here, the switches 11, 13, 15, 17, 19, 21 can be configured as discrete semiconductor switches or as relays.

Figure 2:
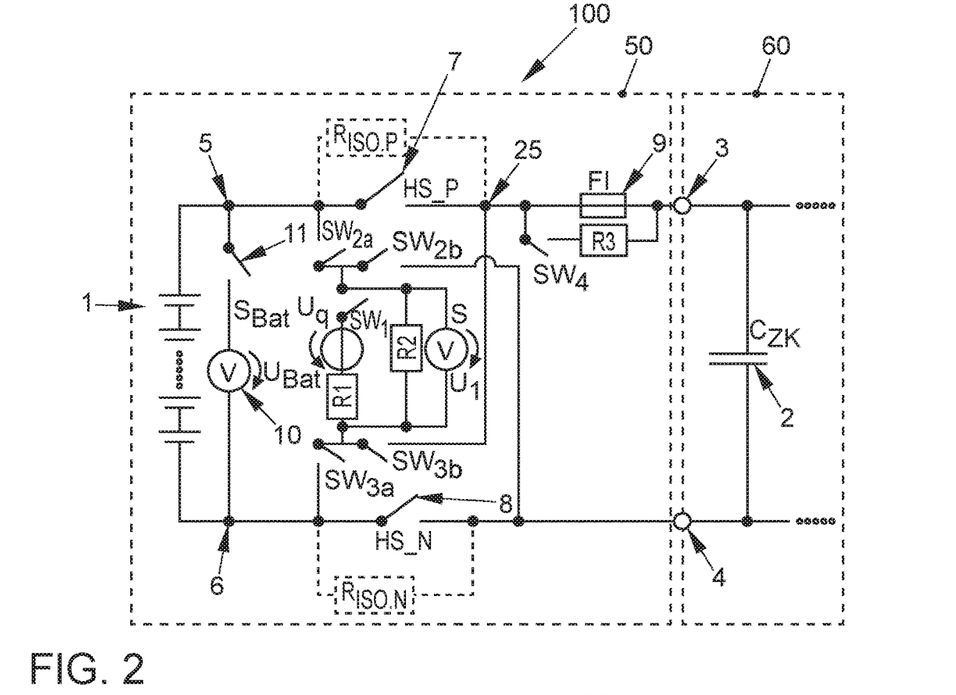
FIG. 2: an electrical system in a second embodiment.

FIG. 2 depicts an alternative embodiment of an electrical system 100, whereby the same elements as in FIG. 1 are designated by the same reference numerals. The circuit, in turn, has a switchable voltage sensor $S_{Bat}$ as well as five switches $SW_{2a}$, $SW_{2b}$, $SW_{3a}$, $SW_{3b}$, $SW_4$, it has a potential-free switchable voltage source $U_q$ with a switch $SW_1$ and it also a potential-free voltage sensor S. A resistor R1 is connected in series to the switch $SW_1$ of the switchable voltage source $U_q$. Another resistor R2 is connected in parallel to the series circuit comprising the switch $SW_1$, the voltage source $U_q$ and the resistor R1. The first switch $SW_{2a}$ is situated between the positive pole 5 of the high-voltage battery 1 and the positive connector of the voltage source $U_q$. The second switch $SW_{2b}$ is situated between the positive connector of the voltage source $U_q$ and the negative connector 4 of the DC link capacitor. The third switch $SW_{3a}$ is situated between the resistor R1 of the voltage source $U_q$ and the negative pole 6 of the high-voltage battery 1. The fourth switch $SW_{3b}$ is situated between the resistor R1 of the voltage source $U_q$ and a connector 25 between the first power relay 7 and the fuse 9. The fifth switch $SW_4$ is connected in series to a resistor R3 in parallel to the fuse 9.

The starting point is once again the initial state (only the sensor $S_{Bat}$ is connected and plausibilized). Owing to the closing of the switches $SW_{2a}$ and $SW_{3a}$, the voltage source $U_q$ is still uncoupled from the rest of the circuit and the sensor S is now connected directly to the high-voltage battery 1. In this manner, the sensor S likewise measures the total high-volt voltage. If the voltage difference between the two sensors $S_{Bat}$, S is smaller than a defined threshold value (e.g. 10 V), the functionality of the sensor S and of the switches $SW_{2a}$ as well as $SW_{3a}$ is ensured. In addition, through a sequential opening/closing, the switches $SW_{2a}$ and $SW_{3a}$ can be diagnosed in terms of their opening/closing. If one of the switches remains permanently open, the value can never fall below the threshold value (e.g. 10 V). However, if one of the two switches is permanently closed, the above-mentioned condition is always fulfilled if one of the appertaining switches is assumed to have been opened. In both cases, an error in the measuring system is detected. Since this resistor R2 is arranged in parallel to the sensor S, the entire source voltage at this resistor drops. In order to limit the losses occurring in R2, said resistor R2 should preferably have a magnitude of at least 1 Mohm.

As the next step, $SW_{2a}$ and $SW_{3a}$ are opened again and $SW_1$ is closed. In this manner, the voltage source $U_q$ applies a voltage drop over the two resistors R1 and R2. Correspondingly to the voltage divider ratio, a voltage is set at the resistor R2 that can be measured with the sensor S if the voltage source $U_q$ and the switch $SW_1$ are functioning correctly.

In addition to the switch $SW_1$, the switches $SW_{2b}$ and $SW_{3b}$ are closed sequentially. As a result, the positive connector of the voltage source is present at the negative pole and the negative connector having the resistor R1 is present at the positive pole of the DC link capacitor 2.

If the switches are functioning properly, the DC link capacitor is charge-reversed. If the capacitor had previously been charge-free, then the magnitude of the DC link voltage rises from zero in the direction of $|U_q*R2/(R1+R2)|$. The voltage at the sensor S likewise drops from $U_q*R2/(R1+R2)$ to zero at the point in time when both switches are connected and this voltage rises like the voltage at the DC link once again in the direction of the original value of $U_q*R2/(R1+R2)$. The dimensioning of the value for the voltage source and for the resistor R1 depends decisively on the magnitude of the DC link capacitance and on the measuring tolerance of the sensor S. The voltage source $U_q$ should deliver a voltage that is greater than the measuring tolerance of the sensor S by a factor of at least three. So that the DC link voltage can be quickly charged to a measurable voltage value, the resistor R1, as the current limiter, must not be selected too large. For example, at a DC link capacitance of 500 μF and a resistance R1 of 100 ohm, a voltage source of 12 V requires about 27 ms to charge to 5 V and about 90 ms to charge to 10 V. In this context, the aim is for the duration of the diagnosis to be kept as short as possible. During this time, in addition to the plausibilization of the fuse 9 and of the switch $SW_4$, the switch itself can be closed and opened again. When the switch is being closed, owing to the additional resistor R3, the DC link capacitor is charged more slowly than is the case if the current flows through the fuse in the opened state. In order the readily recognize the difference, R3 should be at least twice as large as R1.

The power relays 7, 8 can be tested once the plausibilization of all of the sensors and auxiliary switches has been successfully completed. This procedure also takes into consideration the insulation resistance $R_{iso,P}$, $R_{iso,N}$, which consists of a partial resistance between the one connecting point of the appertaining power relay 7, 8 and the housing of the voltage source $U_q$ and also consists of a partial resistance between the housing and the other connecting point of the same power relay 7, 8. For this purpose, the switches $SW_1$, $SW_{2a}$ and $SW_{3b}$ are closed and all of the others are opened. In the case of the open, positive power relay 7 and an insulation fault where $R_{iso,P}$ is considerably smaller than, for instance, 10 Mohm, the sensor S measures a voltage of $U_q*(R2||R_{iso,P})/(R1+(R2||R_{iso,P}))$ since now, a non-negligible insulation resistance is present in parallel to the resistance R2, as a result of which the voltage divider has been changed. If, in contrast, no insulation fault is present at the positive power relay 7, the sensor S continues to measure a voltage of $U_q*R2/(R1+R2)$. If the power relay 7 is stuck, the sensor S is short-circuited via it, and this is detected as a fault. Analogously, in order to plausibilize the negative power relay 8, exclusively the switches $SW_1$, $SW_{2b}$ and $SW_{3a}$ are closed. Here, too, the sensor S has to be able to measure a voltage of $U_q*R2/(R1+R2)$ in the fault-free case.

This yields the following diagnosis sequence by way of an example when the vehicle is started up, before the traction network is connected:

1. All of the switches (except for 11) are initially open.
2. Close switch $SW_{2a}$, then close switch $SW_{3a}$ and subsequently open $SW_{2a}$ (plausibilize $SW_{2a}$, $SW_{3a}$ and sensor S).
3. Open switch $SW_{3a}$ and concurrently close switch $SW_1$ (plausibilize voltage source $U_q$).
4. Close switch $SW_{2b}$, then close switch $SW_{3b}$ (plausibilize $SW_{2b}$ and $SW_{3b}$).
5. If applicable, close switch $SW_4$ (plausibilize fuse and $SW_4$).
6. Open switch $SW_{2b}$ and concurrently close switch $SW_{2a}$ (plausibilize power relay 7).
7. Open switch $SW_{2a}$ and concurrently close switch $SW_{2b}$, then open switch $SW_{3b}$ and concurrently close switch $SW_{3a}$ (plausibilize power relay 8).
8. All of the switches (except for 11) are opened once again.

Moreover, this circuit also has the advantage that, using the sensor S, the voltage of the DC link capacitor during the pre-charging can be detected and used to regulate the DC/DC converter.

Figure 3:
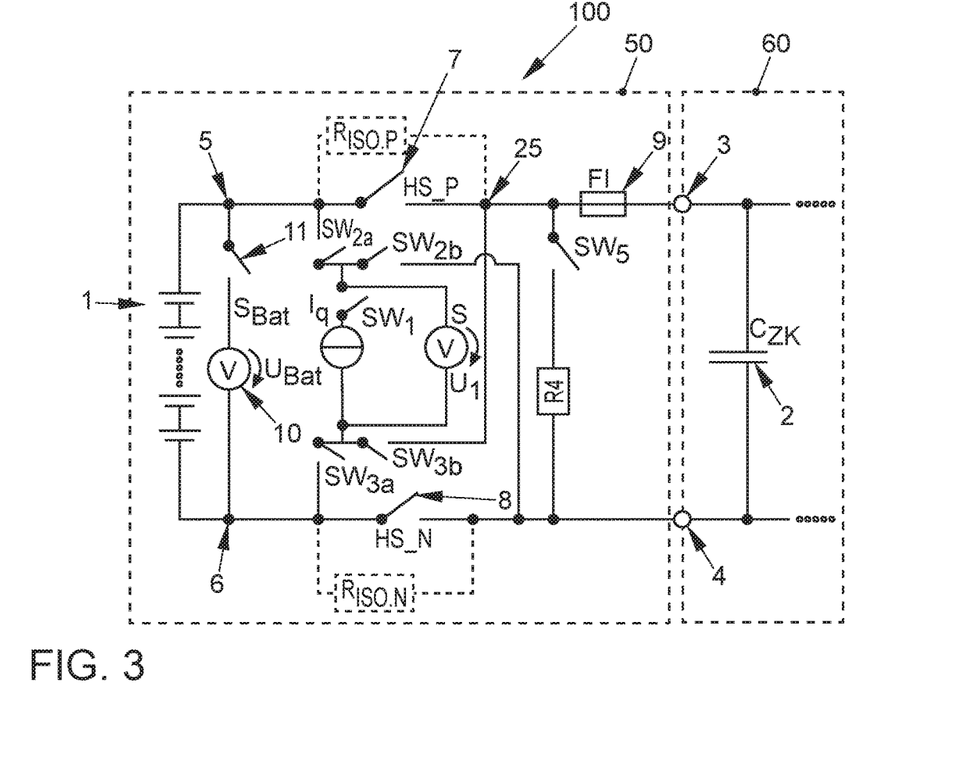
FIG. 3: an electrical system in a third embodiment.

FIG. 3 shows a third embodiment of an electrical system 100 which largely corresponds to the circuit shown in FIG. 2. The difference lies in the fact that the voltage source $U_q$ and the resistors R1, R2 are replaced by a switchable current source $I_q$. Moreover, the fifth switch $SW_4$ having a resistor R3 is replaced by a switch $SW_5$ having a resistor R4, situated between the connecting point 25 and the negative connector 4 of the DC link capacitor 2.

However, the mode of operation and the procedure are similar. The plausibilization of the switches $SW_{2b}$ and $SW_{3b}$ is carried out by means of the connectable resistor R4. In contrast, during the brief charging of the DC link capacitor 2 by the current source $I_q$, the fuse 9 is tested after the $SW_{2b}$ and $SW_{3b}$ have been closed. If one of the two power relays 7, 8 is stuck, the current source would be short-circuited by it and the sensor S would detect this fault.

The underlying idea of the two above-mentioned circuits is the possibility to diagnose the power relays 7, 8 by a suitable connection of an active source to these two power relays in order to detect their state.

Figure 4:
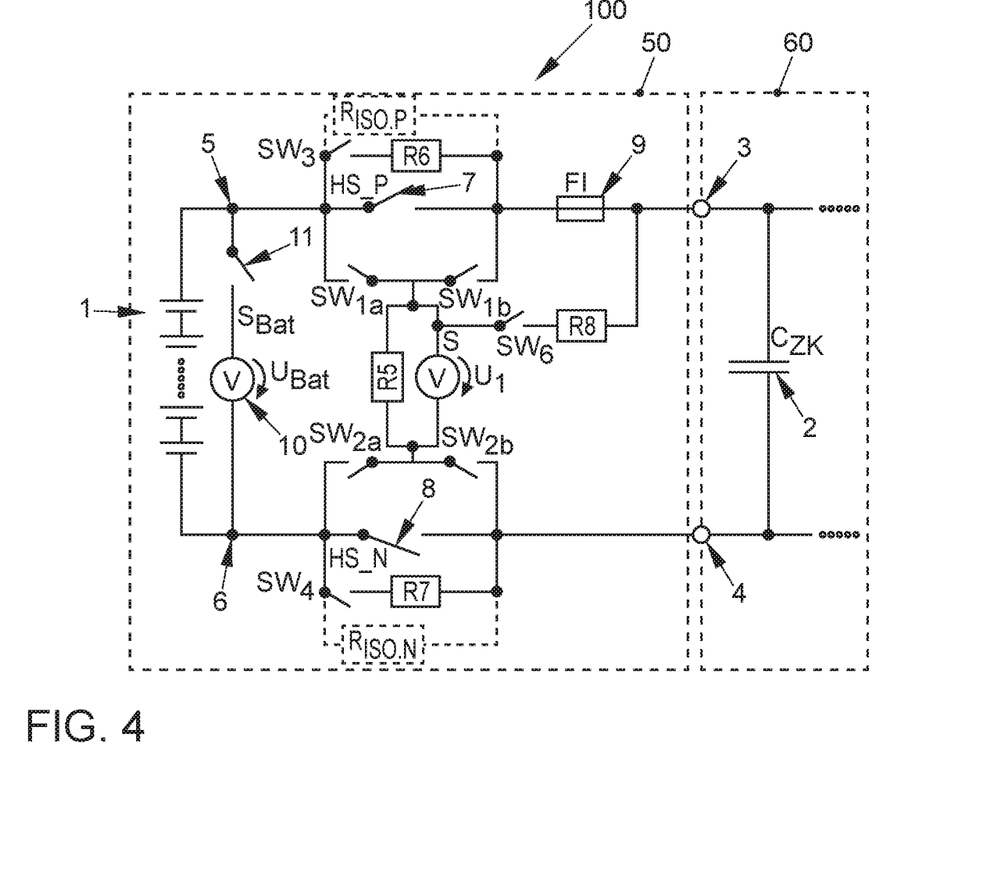
FIG. 4: an electrical system in a fourth embodiment.

FIG. 4 shows another alternative embodiment, whereby, unlike FIG. 2 and FIG. 3, the high-voltage battery 1 is the switchable source of energy, whereby, however, a larger number of switches and resistors is needed.

The following diagnosis sequence can be implemented with this circuit:

1. Establish the initial state (only the sensor $S_{Bat}$ is connected and has already been plausibilized).

2. Close switch $SW_{1a}$ and switch $SW_{2a}$ one after the other and open them again (plausibilize $SW_{1a}$, $SW_{2a}$ and sensor S).
3. Close switch $SW_{1a}$, open switch $SW_{2a}$, then close switch $SW_{2b}$ and shortly thereafter likewise close $SW_4$ (plausibilize $SW_{2b}$, $SW_4$ and power relay 8). If the power relay 8 is stuck, the battery voltage is present at the sensor S immediately after the switch $SW_{2b}$ has been closed. In contrast, if the power relay 8 is open but an insulation fault is present, the resistors R5 and $R_{iso,N}$ form a voltage divider via the source. Since the insulation resistance is not known, the switch $SW_4$ connects a defined resistance in order to bring about a voltage change at the sensor S, thereby recognizing the fault. If the power relay 8 is open and no insulation fault is present, the sensor S can only detect a defined voltage value of $U_{Bat}$ R5/(R5+R7) once the switches $SW_{2b}$, $SW_4$ are being closed.
4. The switches $SW_{1a}$, $SW_{2b}$ and $SW_4$ are opened, then switch $SW_{2a}$, $SW_{1b}$ and subsequently switch $SW_3$ are closed (plausibilize $SW_{2a}$, $SW_3$ and power relay 7).
5. Open switch $SW_{1b}$ and then close switch $SW_6$ (plausibilize $SW_6$ and fuse).

In order to minimize losses, the resistances should have high values (e.g. 1 Mohm). Since all of the switches connect and disconnect the source of energy, they have to be dimensioned for the voltage that is present at the source.

The invention claimed is:

1. An electrical system comprising:
   at least one high-voltage battery;
   at least one DC link capacitor; and
   two power relays, wherein the two power relays include:
     a first power relay arranged between a positive connector of the at least one high-voltage battery and the at least one DC link capacitor, and
     a second power relay arranged between a negative connector of the at least one high-voltage battery and the at least one DC link capacitor;
   a galvanically isolated DC/DC converter that is connected to a voltage source in the electrical system, whereby the DC/DC converter is configured to transmit electric energy to a high-voltage side with the at least one DC link capacitor in order to pre-charge the at least one DC link capacitor; and
   a diagnostic device configured to test the two power relays, whereby the diagnostic device has switchable voltage sensors, whereby the switchable voltage sensors include:
     a first voltage sensor arranged in parallel to the at least one high-voltage battery,
     a second voltage sensor arranged in parallel to the at least one DC link capacitor,
     a third voltage sensor arranged in parallel to the first power relay,
     a fourth voltage sensor arranged in parallel to the second power relay,
     a fifth voltage sensor arranged between the positive connector of the at least one high-voltage battery and the negative connector of the at least one DC link capacitor, and
     a sixth voltage sensor arranged between the negative connector of the at least one high-voltage battery and a connector between the first power relay and the positive connector of the at least one DC link capacitor.

2. The electrical system according to claim 1, further comprising a fuse arranged between the first power relay and the positive connector of the at least one DC link capacitor, wherein a connector for the sixth voltage sensor is situated between the first power relay and the fuse.

3. An electrical system, comprising:
   at least one high-voltage battery;
   at least one DC link capacitor;
   two power relays, wherein the two power relays include:
     a first power relay situated between a positive connector of the at least one high-voltage battery and the at least one DC link capacitor and
     a second power relay arranged between a negative connector of the at least one high-voltage battery and the at least one DC link capacitor;
   a galvanically isolated DC/DC converter that is connected to a voltage source in the electrical system, whereby the DC/DC converter is configured to transmit electric energy to a high-voltage side with the at least one DC link capacitor in order to pre-charge the at least one DC link capacitor; and
   a diagnostic device configured to test the two power relays, whereby the diagnostic device includes
     a switchable voltage sensor arranged in parallel to the at least one high-voltage battery,
     at least one switchable source of energy, and
     a plurality of switches connected to at least one of the two power relays to diagnose the functionality of the two power relays.

4. The electrical system according to claim 3, further comprising:
   a series circuit which includes a first resistor connected in series to the at least one switchable source of energy, which is configured as a voltage source,
   a second resistor and a voltage sensor arranged in parallel to the series circuit,
   wherein the plurality of switches includes:
     a first switch situated between the positive connector of the at least one high-voltage battery and a positive connector of the switchable voltage source,
     a second switch situated between the positive connector of the switchable voltage source and the negative connector of the at least one DC link capacitor,
     a third switch situated between the negative connector of the switchable voltage source and the negative connector of the at least one high-voltage battery,
     a fourth switch situated between the negative connector of the switchable voltage source and a connecting point between the first power relay and the positive connector of the at least one DC link capacitor, and
     a fifth switch connected in series to a third resistor parallel to a fuse that is situated between the connecting point for the fourth switch and the positive connector of the at least one DC link capacitor.

5. The electrical system according to claim 3, wherein the switchable source of energy is configured as a current source to which a voltage sensor is arranged in parallel, the plurality of switches including:
   a first switch situated between the positive connector of the at least one high-voltage battery and a positive connector of the switchable current source,
   a second switch situated between the positive connector of the switchable current source and a negative connector of the at least one DC link capacitor,
   a third switch situated between the negative connector of the switchable current source and a negative connector of the at least one high-voltage battery,
   a fourth switch situated between the negative connector of the switchable current source and a connecting point between the first power relay and a positive connector of the at least one DC link capacitor,
a fifth switch that is connected in series to a fourth resistor situated between the connecting point of the fourth switch and the negative connector of the at least one DC link capacitor.

6. The electrical system according to claim 3, wherein the switchable source of energy is the at least one high-voltage battery, the electrical system further comprising:
the plurality of switches including:
a first switch and a second switch arranged in parallel to the first power relay,
a third switch and a fourth switch arranged in parallel to the second power relay,
a fifth switch connected in series with a second resistor, wherein the fifth switch and the second resistor are arranged in parallel to the first power relay at the positive connector of the at least one high-voltage battery,
a sixth switch connected in series with a third resistor, wherein the sixth switch and the third resistor are arranged in parallel to the second power relay at the negative connector of the at least one high-voltage battery,
a seventh switch that is connected in series to a fourth resistor;
a voltage sensor connected in parallel with a first resistor, wherein the voltage sensor and first resistor are arranged between a first center tap between the first and second switches and between a second center tap between the third and fourth switches, wherein
the seventh switch and the fourth resistor are arranged between the first center tap and a positive connector of the at least one DC link capacitor.

* * * * *